United States Patent
Kitagawa

(10) Patent No.: US 9,681,544 B2
(45) Date of Patent: Jun. 13, 2017

(54) PRINTED SUBSTRATE AND SHIELD SHEET METAL FIXING METHOD

(71) Applicant: FUJITSU LIMITED, Kawasaki-shi, Kanagawa (JP)

(72) Inventor: Takahiro Kitagawa, Kawasaki (JP)

(73) Assignee: FUJITSU LIMITED, Kawasaki-Shi (JP)

( * ) Notice: Subject to any disclaimer, the term of this patent is extended or adjusted under 35 U.S.C. 154(b) by 0 days.

(21) Appl. No.: 15/070,659

(22) Filed: Mar. 15, 2016

(65) Prior Publication Data

US 2016/0323990 A1    Nov. 3, 2016

(30) Foreign Application Priority Data

Apr. 28, 2015   (JP) ................ 2015-091578

(51) Int. Cl.
*H05K 1/02*   (2006.01)
*H05K 1/11*   (2006.01)

(52) U.S. Cl.
CPC .......... *H05K 1/111* (2013.01); *H05K 1/0216* (2013.01); *H05K 2201/099* (2013.01); *H05K 2201/09272* (2013.01); *H05K 2201/10371* (2013.01)

(58) Field of Classification Search
CPC ......... H05K 1/111; H05K 2201/09272; H05K 2201/10371
See application file for complete search history.

(56) References Cited

U.S. PATENT DOCUMENTS

| | | | | |
|---|---|---|---|---|
| 5,838,070 A * | 11/1998 | Naruse | ......... | H05K 1/111 257/693 |
| 9,162,922 B2 * | 10/2015 | Kaneko | ......... | H05K 1/0306 |
| 9,214,259 B2 * | 12/2015 | Adachi | ......... | H01B 3/12 |
| 9,510,452 B2 * | 11/2016 | Yumi | ......... | H05K 1/181 |
| 2008/0266825 A1 * | 10/2008 | Tokii | ......... | H05K 1/111 361/772 |
| 2009/0116203 A1 * | 5/2009 | Matsuno | ......... | H01L 24/16 361/760 |
| 2012/0162930 A1 * | 6/2012 | Huang | ......... | H05K 1/0218 361/728 |
| 2014/0009875 A1 * | 1/2014 | Nakagawa | ......... | H05K 7/06 361/679.01 |
| 2014/0049929 A1 * | 2/2014 | Yamaguchi | ......... | H05K 1/0216 361/782 |

(Continued)

FOREIGN PATENT DOCUMENTS

| | | |
|---|---|---|
| JP | 8-130361 | 5/1996 |
| JP | 2003-69168 | 3/2003 |

*Primary Examiner* — Hung V Ngo
(74) *Attorney, Agent, or Firm* — Staas & Halsey LLP

(57) ABSTRACT

A printed substrate includes: a substrate; a copper layer formed on the substrate; and a resin formed on the substrate to cover a part of the copper layer, wherein the copper layer includes a first region covered by the resin and a second region in which a shield sheet metal is installed, the shield sheet metal surrounding a predetermined region of the substrate, and wherein an angle formed between an outer edge portion of the copper layer covered by the resin and an outer edge portion of the resin which covers the copper layer at a location at which the outer edge portion of the copper layer and the outer edge portion of the resin intersect each other as viewed in plan is an obtuse angle.

5 Claims, 9 Drawing Sheets

(56) References Cited

U.S. PATENT DOCUMENTS

| | | | | |
|---|---|---|---|---|
| 2014/0313633 A1* | 10/2014 | Fujimori | ............... | H05F 3/04 361/220 |
| 2015/0003023 A1* | 1/2015 | Yamamoto | ............... | H05K 3/30 361/748 |
| 2015/0029682 A1* | 1/2015 | Kadoya | ............... | H05K 9/0039 361/748 |

* cited by examiner

PRINTED SUBSTRATE AND SHIELD SHEET METAL FIXING METHOD

CROSS-REFERENCE TO RELATED APPLICATION

This application is based upon and claims the benefit of priority of the prior Japanese Patent Application No. 2015-091578, filed on Apr. 28, 2015, the entire contents of which are incorporated herein by reference.

FIELD

The embodiment discussed herein is related to a printed substrate and a shield sheet metal fixing method.

BACKGROUND

In electronic devices such as mobile phones, smartphones, and tablet terminals, a shield sheet metal that surrounds components mounted on a substrate (hereinafter referred to as "mounted components") is mounted on the substrate as measures against noise generated by the mounted components. The shield sheet metal suppresses electromagnetic waves (noise) generated by the mounted components, and is mounted on the substrate by a surface mount technology (SMT).

The shield sheet metal is large in size compared to the mounted components. Therefore, a strong stress tends to be applied to a solder joint portion at which a copper foil formed on the substrate and the shield sheet metal are joined to each other when a drop impact or the like is applied to the electronic device. An excessive stress may cause separation of the copper foil. Separation of the copper foil may lead to a reduction in reliability. Therefore, measures against separation of the copper foil have been requested.

The followings are reference documents.
[Document 1] Japanese Laid-open Patent Publication No. 2003-69168 and
[Document 2] Japanese Laid-open Patent Publication No. 08-130361.

SUMMARY

According to an aspect of the invention, a printed substrate includes: a substrate; a copper layer formed on the substrate; and a resin formed on the substrate to cover a part of the copper layer, wherein the copper layer includes a first region covered by the resin and a second region in which a shield sheet metal is installed, the shield sheet metal surrounding a predetermined region of the substrate, and wherein an angle formed between an outer edge portion of the copper layer covered by the resin and an outer edge portion of the resin which covers the copper layer at a location at which the outer edge portion of the copper layer and the outer edge portion of the resin intersect each other as viewed in plan is an obtuse angle.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment according to the disclosure will be described with reference to the drawings.

Figure 1:
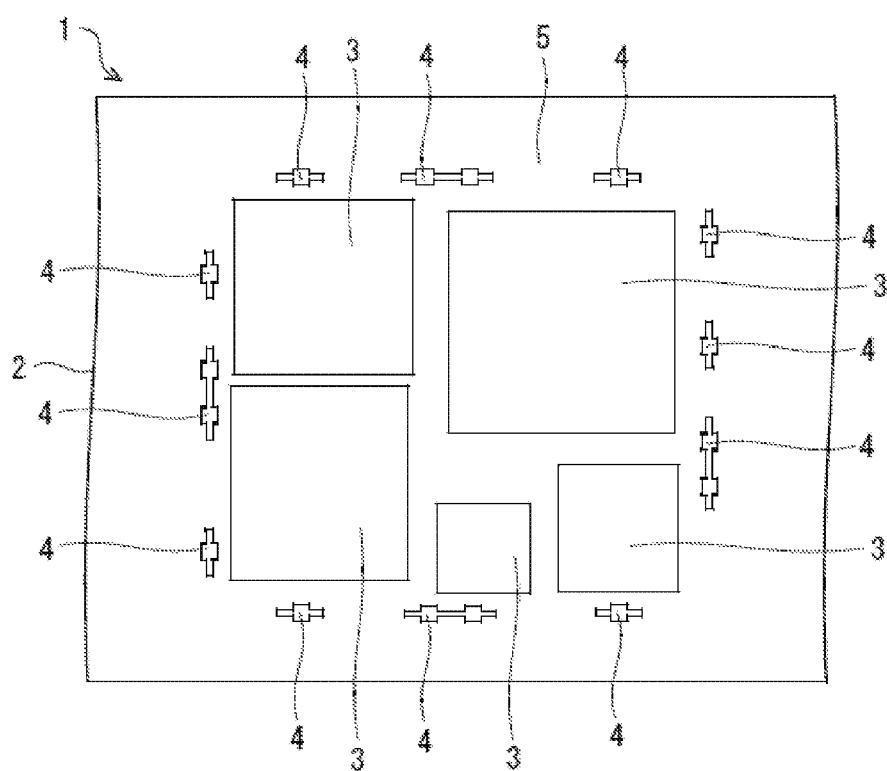
FIG. 1 is a top view of a printed substrate according to an embodiment.

FIG. 1 is a top view (plan view) of a printed substrate 1 according to the embodiment. The printed substrate 1 includes a substrate (base material) 2, a plurality of circuits 3 formed on the substrate 2, a plurality of foot patterns 4, and a resist 5. The printed substrate 1 is mounted in an electronic device such as a mobile phone, a smartphone, and a tablet terminal, for example. The substrate 2 is a glass epoxy resin substrate, for example, and is formed in a plate shape. The circuits 3 are semiconductor chips such as integrated circuits (ICs) and large-scale integrations (LSIs), for example. The circuits 3 may be a semiconductor package. The foot patterns 4 are formed on the substrate 2 by processing a copper foil. The foot patterns 4 are an example of the copper foil. The resist 5 is a thermosetting resin such as an epoxy resin, for example. The resist 5 is formed on the substrate 2 using a printing method such as screen printing, for example.

Figure 2:
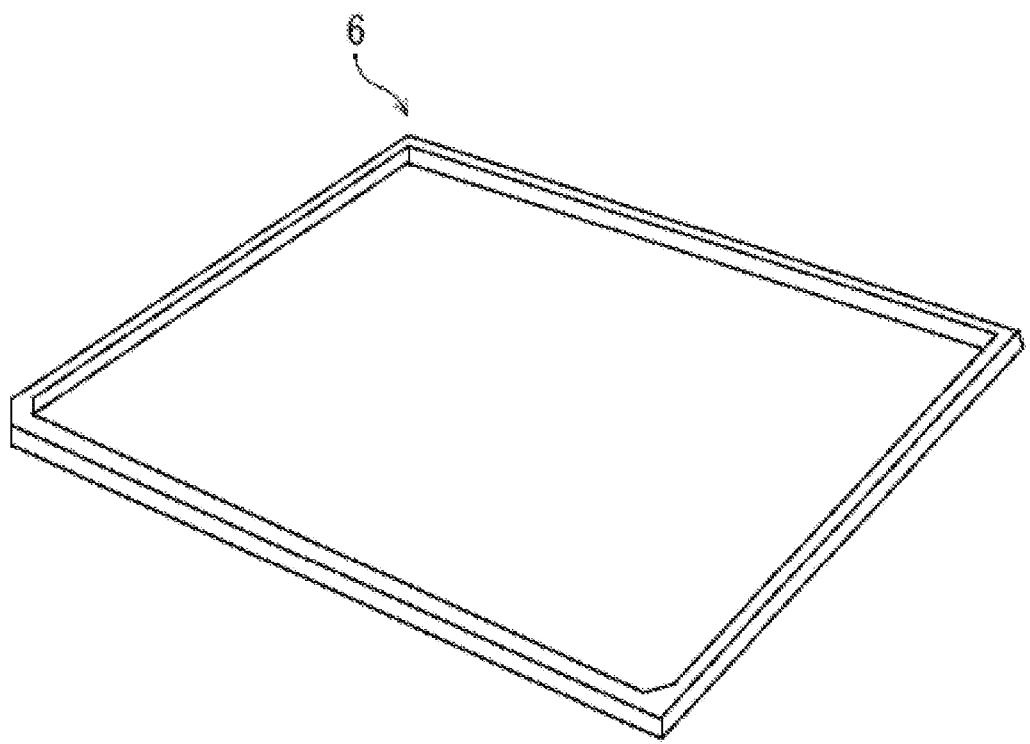
FIG. 2 is a perspective view of a shield sheet metal.

A shield sheet metal 6 is installed on the substrate 2 so as to surround a region of the substrate 2 in which the circuits 3 are formed. The region of the substrate 2 in which the circuits 3 are formed is an example of the predetermined region of the substrate. FIG. 2 is a perspective view of the shield sheet metal 6. The shield sheet metal 6 is formed as a member made of metal such as stainless steel, aluminum, copper, or iron, for example. FIG. 2 illustrates the shield sheet metal 6 in a frame shape. After the shield sheet metal 6 is mounted onto the substrate 2, a shield sheet metal in a lid shape is attached onto the shield sheet metal 6. The shield sheet metal 6 is not limited to the example illustrated in FIG. 2, and may be in a recessed shape in which a sheet metal in a frame shape and a sheet metal in a lid shape are integrated with each other. The shield sheet metal 6 suppresses radiation of electromagnetic waves (noise) generated by the circuits 3. In addition, the shield sheet metal 6 protects the circuits 3 from a shock due to a fall of the electronic device (hereinafter referred to also as a "drop impact") or the like. A plurality of shield sheet metals 6 may be installed on the substrate 2. For example, a first shield sheet metal 6 may be installed so as to surround a first circuit 3, and a second shield sheet metal 6 may be installed so as to surround a second circuit 3, depending on the characteristics of the circuits 3.

Figure 3:
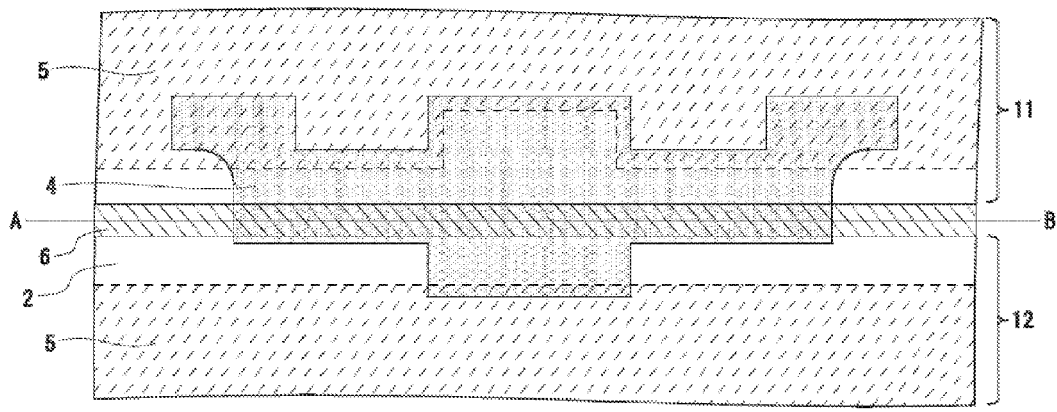
FIG. 3 is a top view of a foot pattern.

As illustrated in FIG. 1, the plurality of foot patterns 4 are formed, as separated from each other, so as to surround the region in which the circuits 3 are formed. FIG. 3 is a top view of the foot pattern 4. In the example illustrated in FIG. 3, a region 11 of the substrate 2 is a region outside the shield sheet metal 6, and a region 12 of the substrate 2 is a region inside the shield sheet metal 6. The foot pattern 4 has a cross-shaped portion and rectangular portions connected to end portions of the cross-shaped portion as viewed in plan. The resist 5 covers a part of the foot pattern 4. The resist 5 suppresses separation of the foot pattern 4 from the substrate 2. In FIG. 3, a portion in which the resist 5 is formed is indicated as hatched by dotted oblique lines. In addition, the shield sheet metal 6 is formed on the substrate 2 so as to extend across the foot pattern 4. Thus, the foot pattern 4 includes a region covered by the resist 5 and a region in which the shield sheet metal 6 is installed. The region covered by the resist 5 is an example of the first region. The region in which the shield sheet metal 6 is installed is an example of the second region.

Figure 4:
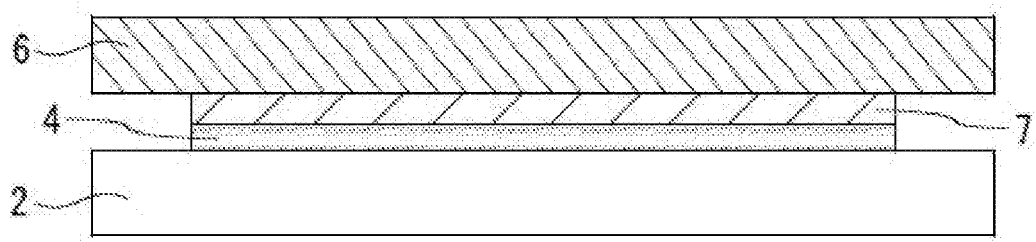
FIG. 4 is a sectional view of the foot pattern.

FIG. 4 is a sectional view of the foot pattern 4, illustrating a section taken along the solid line IV-IV of FIG. 3. Solder 7 is formed between the foot pattern 4 and the shield sheet metal 6. Examples of the solder 7 include Sn—Ag and Sn—Ag—Cu. The solder 7 is joined to the foot pattern 4 and the shield sheet metal 6, and the shield sheet metal 6 is fixed to the foot pattern 4. In order to enhance the initial connectivity between the foot pattern 4 and the solder 7, an exposed portion (portion on which the resist 5 is not formed) of the foot pattern 4 may be plated with Au. In the example illustrated in FIG. 3, the center portion of the foot pattern 4 is shaped to be wider than both end portions of the foot pattern 4. This makes it easy to collect the solder 7 at the center portion of the foot pattern 4 in order to form a fillet of the solder 7 at the center portion of the foot pattern 4.

A method of fixing the shield sheet metal 6 (shield sheet metal fixing method) will be described. The method of fixing the shield sheet metal 6 may be used as a part of a method of manufacturing the printed substrate 1. First, a substrate 2 is prepared, and foot patterns 4 are formed on the substrate 2. For example, a copper foil may be formed on the substrate 2 by sputtering and electroplating, and the copper foil may be formed into a predetermined pattern by etching. Alternatively, for example, a copper foil may be laminated on the substrate 2, and the copper foil may be formed into a predetermined pattern by etching.

Next, solder paste (cream solder) is supplied onto the foot pattern 4. The solder paste contains solder powder and flux. Then, a shield sheet metal 6 is disposed on the substrate 2. In this case, the shield sheet metal 6 is positioned to bring the shield sheet metal 6 into contact with the solder paste. Next, a reflow process (a heating process and a cooling process) is performed to melt the solder powder and vaporize the flux so that the solder 7 is joined to the foot patterns 4 and the shield sheet metal 6. The solder 7 is joined to the foot patterns 4 and the shield sheet metal 6 so that the shield sheet metal 6 is fixed to the foot patterns 4. That is, the shield sheet metal 6 is fixed to the foot patterns 4 by the solder 7.

As illustrated in FIG. 3, the outer peripheral portion of the foot pattern 4 has a portion covered by the resist 5 (a portion on which the resist 5 is formed) and a portion not covered by the resist 5 (a portion on which the resist 5 is not formed). A structure in which the outer peripheral portion of the foot pattern 4 is covered by the resist 5 is called a "resist overlap structure (over resist structure)". A structure in which the outer peripheral portion of the foot pattern 4 is not covered by the resist 5 is called a "non-resist overlap structure (non-over resist structure)".

Figure 5A:
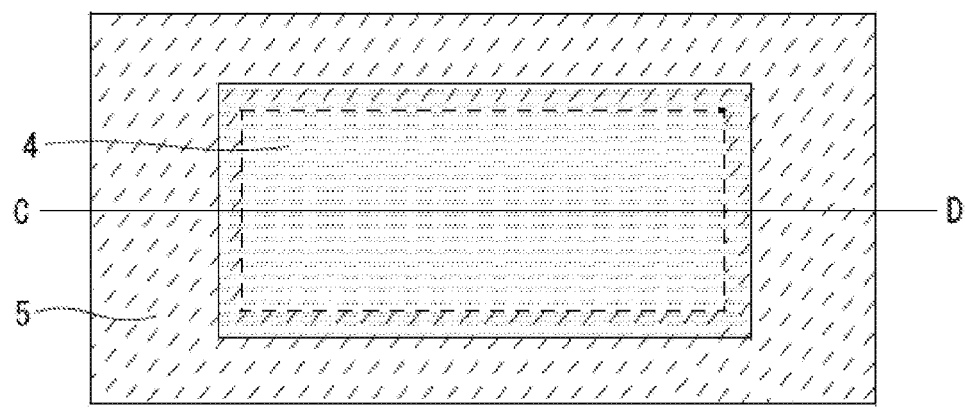
FIGS. 5A and 5B illustrate a resist overlap structure.
Figure 5B:
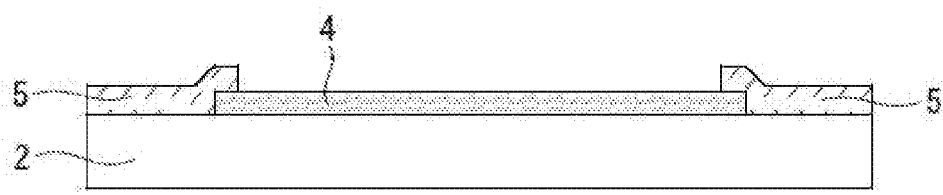
Figure 6A:
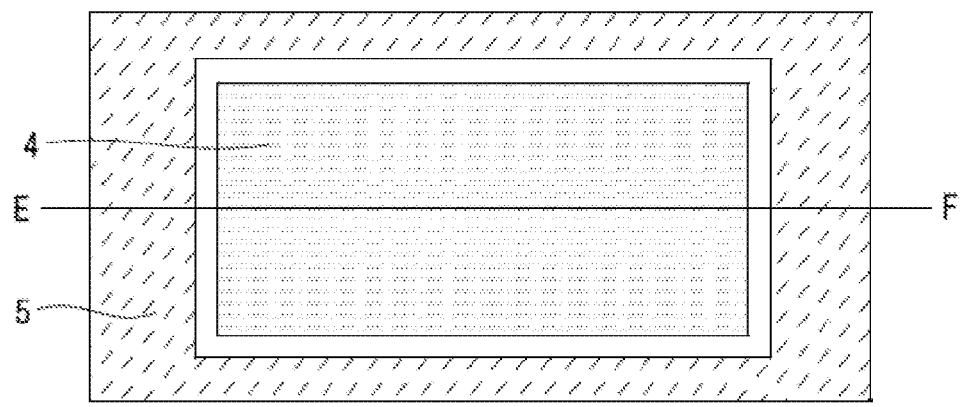
FIGS. 6A and 6B illustrate a non-resist overlap structure.
Figure 6B:
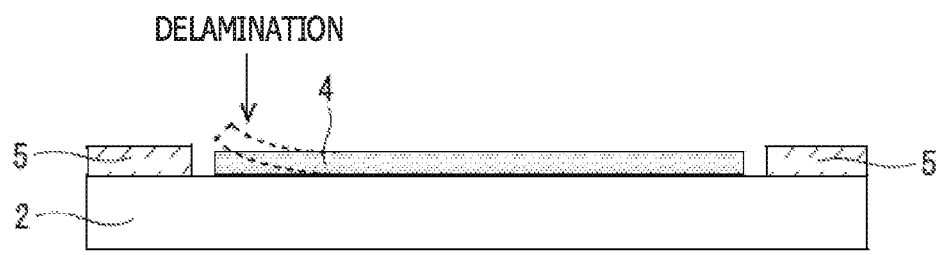

The resist overlap structure and the non-resist overlap structure will be described. FIGS. 5A and 5B illustrate the resist overlap structure. FIGS. 6A and 6B illustrate the non-resist overlap structure. FIG. 5A is a top view of the foot pattern 4 which is formed on the substrate 2. FIG. 5B is a sectional view of the foot pattern 4 which is formed on the substrate 2, illustrating a section taken along the solid line VB-VB of FIG. 5A. FIG. 6A is a top view of the foot pattern 4 which is formed on the substrate 2. FIG. 6B is a sectional view of the foot pattern 4 which is formed on the substrate 2, illustrating a section taken along the solid line VIB-VIB of FIG. 6A.

In the resist overlap structure, as illustrated in FIGS. 5A and 5B, the resist 5 covers the outer peripheral portion of the foot pattern 4. Therefore, the resist overlap structure is resistant to separation of the foot pattern 4. In the resist overlap structure, the resist 5 bears down the outer edge portion of the foot pattern 4, and therefore separation of the foot pattern 4 from the substrate 2 is suppressed. In the resist overlap structure, as illustrated in FIGS. 5A and 5B, the resist 5 covers the outer edge portion of the foot pattern 4. Therefore, a step is produced at the boundary portion between the foot pattern 4 and the resist 5. Therefore, in the case where the shield sheet metal 6 is installed on the foot pattern 4, a void (gap) may be produced between the foot pattern 4 and the shield sheet metal 6, depending on the installation position of the shield sheet metal 6.

In the non-resist overlap structure, as illustrated in FIGS. 6A and 6B, the resist 5 does not cover the outer peripheral portion of the foot pattern 4. Therefore, the non-resist overlap structure is not resistant to separation of the foot pattern 4. In the non-resist overlap structure, as illustrated in FIGS. 6A and 6B, the foot pattern 4 and the resist 5 are spaced from each other. Therefore, a step is not present at the boundary portion between the foot pattern 4 and the resist 5. Therefore, production of a void between the foot pattern 4 and the shield sheet metal 6 is suppressed in the case where the shield sheet metal 6 is installed on the foot pattern 4.

In the example illustrated in FIG. 3, the resist 5 covers a part of the outer peripheral portion of the foot pattern 4. Therefore, separation of the foot pattern 4 from the substrate 2 is suppressed. In the example illustrated in FIG. 3, in addition, the resist 5 does not cover the foot pattern 4 in the region of the foot pattern 4 in which the shield sheet metal 6 is installed. Therefore, production of a void between the foot pattern 4 and the shield sheet metal 6 is suppressed.

The region outside the shield sheet metal 6 is not surrounded by the shield sheet metal 6. Thus, a stress generated by a drop impact or the like tends to concentrate on the region outside the shield sheet metal 6 rather than the region inside the shield sheet metal 6. Therefore, a large part of the foot pattern 4 in the region outside the shield sheet metal 6 is covered by the resist 5. That is, the area of the resist 5 which covers the foot pattern 4 in the region outside the shield sheet metal 6 is larger than the area of the resist 5 which covers the foot pattern 4 in the region inside the shield sheet metal 6.

In the example illustrated in FIG. 3, a large part of the region outside the shield sheet metal 6 has the resist overlap structure, in contrast to which only the center portion of the region inside the shield sheet metal 6 has the resist overlap structure and both end portions of the region inside the shield sheet metal 6 have the non-resist overlap structure. In the case of the non-resist overlap structure, a groove is formed between the copper foil and the resist 5. Therefore, solder paste also flows into the groove when solder paste is supplied, which increases the supply amount of solder paste for the groove. If the supply amount of solder paste is increased, the height of molten solder during heating is increased, which makes it easier to fill the void between the foot pattern 4 and the shield sheet metal 6. In order to make use of the advantage, it is preferable to reduce the area of the resist overlap structure for the region inside the shield sheet metal 6. For example, the center portion and both end portions of the region inside the shield sheet metal 6 may have the non-resist overlap structure.

Figure 7:
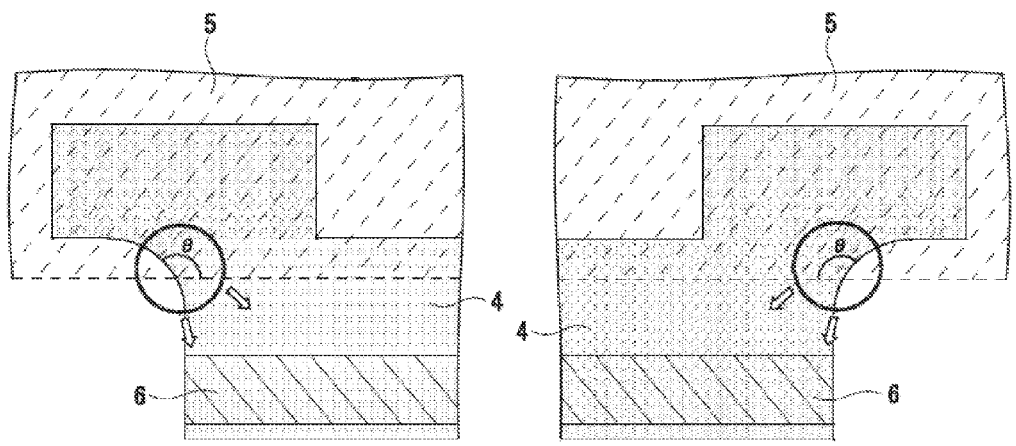
FIG. 7 is a partial enlarged view of the foot pattern.

As illustrated in FIG. 3, there are locations at which the outer edge portion of the foot pattern 4 and the outer edge portion of the resist 5 intersect each other as viewed in plan in the region outside the shield sheet metal 6. The outer edge portion of the foot pattern 4 corresponds to the boundary portion between the side surfaces and the upper surface of the foot pattern 4. The outer edge portion of the resist 5 corresponds to the boundary portion between the side surfaces and the upper surface of the resist 5. FIG. 7 is a partial enlarged view of the foot pattern 4. Circled portions illustrated in FIG. 7 correspond to the locations at which the outer edge portion of the foot pattern 4 and the outer edge portion of the resist 5 intersect each other as viewed in plan. A portion of the foot pattern 4 that extends from one end portion to the other end portion is joined to the shield sheet metal 6 via the solder 7. In the case where a drop impact is transmitted to the shield sheet metal 6, a stress tends to be produced in the direction of extension of the shield sheet metal 6. Therefore, a stress produced by a drop impact or the like tends to concentrate on the end portions of the foot pattern 4. As a result, a stress produced by a drop impact or the like concentrates on the locations at which the outer edge portion of the foot pattern 4 and the outer edge portion of the resist 5 intersect each other as viewed in plan.

As illustrated in FIG. 7, at the locations at which the outer edge portion of the foot pattern 4 and the outer edge portion of the resist 5 intersect each other as viewed in plan, the angle formed between the outer edge portion of the foot pattern 4 which is covered by the resist 5 and the outer edge portion of the resist 5 which covers the foot pattern 4 is an obtuse angle (90 degrees<θ<180 degrees). In other words, with the point at which the outer edge portion of the foot pattern 4 and the outer edge portion of the resist 5 intersect each other as viewed in plan defined as the vertex, the angle formed between the outer edge portion of the foot pattern 4 which passes through the vertex and the outer edge portion of the resist 5 which passes through the vertex in the region in which the foot pattern 4 and the resist 5 overlap each other is an obtuse angle.

In the example illustrated in FIGS. 3 and 7, the outer edge portion of the foot pattern 4 is formed as curved at the locations at which the outer edge portion of the foot pattern 4 and the outer edge portion of the resist 5 intersect each other as viewed in plan. That is, a part of the outer edge portion of the foot pattern 4 is formed as curved in the direction of extension of the shield sheet metal 6 and in the direction away from the center of the foot pattern 4.

As illustrated in FIG. 7, with the angle formed between the outer edge portion of the foot pattern 4 and the outer edge portion of the resist 5 being an obtuse angle, a stress at the locations at which the outer edge portion of the foot pattern 4 and the outer edge portion of the resist 5 intersect each other as viewed in plan is distributed. Consequently, separation and rupture of the foot pattern 4 is suppressed at the locations at which the outer edge portion of the foot pattern 4 and the outer edge portion of the resist 5 intersect each other as viewed in plan. In addition, a crack (break) of the solder 7 is suppressed.

In the example illustrated in FIGS. 3 and 7, separation and rupture of the foot pattern 4 at the locations at which the outer edge portion of the foot pattern 4 and the outer edge portion of the resist 5 intersect each other as viewed in plan is suppressed in the region outside the shield sheet metal 6. The printed substrate 1 according to the embodiment is not limited to that in the example illustrated in FIGS. 3 and 7. At the locations at which the outer edge portion of the foot pattern 4 and the outer edge portion of the resist 5 intersect each other as viewed in plan in the region inside the shield sheet metal 6, the angle formed between the outer edge portion of the foot pattern 4 which is covered by the resist 5 and the outer edge portion of the resist 5 which covers the foot pattern 4 may be an obtuse angle.

In the example illustrated in FIGS. 3 and 7, the foot pattern 4 has a cross-shaped portion and rectangular portions connected to end portions of the cross-shaped portion as viewed in plan. The printed substrate 1 according to the embodiment is not limited to that in the example illustrated in FIGS. 3 and 7. The foot pattern 4 may have a cross shape or a rectangular shape as viewed in plan.

In the example illustrated in FIGS. 3 and 7, the outer edge portion of the foot pattern 4 is formed as curved at the locations at which the outer edge portion of the foot pattern 4 and the outer edge portion of the resist 5 intersect each other as viewed in plan. The printed substrate 1 according to the embodiment is not limited to that in the example illustrated in FIGS. 3 and 7. The outer edge portion of the foot pattern 4 may be formed linearly at the locations at which the outer edge portion of the foot pattern 4 and the outer edge portion of the resist 5 intersect each other as viewed in plan.

Figure 8:
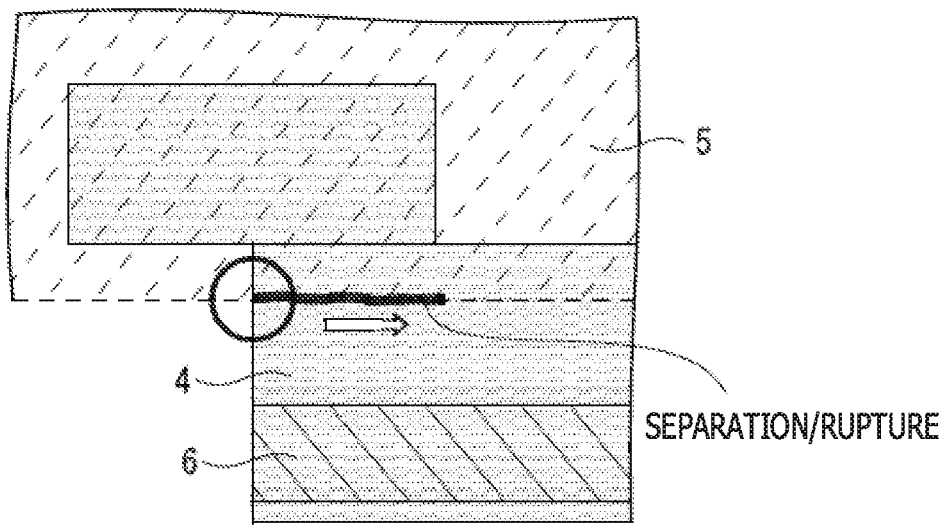
FIG. 8 is a partial enlarged view of a foot pattern.
Figure 9:
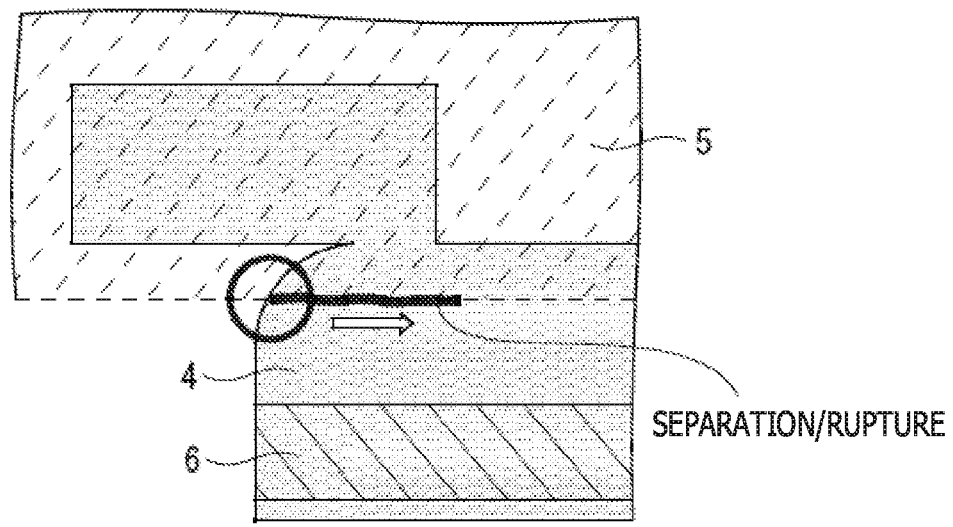
FIG. 9 is a partial enlarged view of a foot pattern.

FIGS. 8 and 9 illustrate the effect of a stress produced by a drop impact or the like, and are each a partial enlarged view of the foot pattern 4. The example illustrated in FIG. 8 is for reference. At the locations at which the outer edge portion of the foot pattern 4 and the outer edge portion of the resist 5 intersect each other as viewed in plan, the angle formed between the outer edge portion of the foot pattern 4 which is covered by the resist 5 and the outer edge portion of the resist 5 which covers the foot pattern 4 is a right angle. As illustrated in FIG. 8, in the region on which a stress produced by a drop impact or the like concentrates, the outer edge portion of the foot pattern 4 and the outer edge portion of the resist 5 which covers the foot pattern 4 perpendicularly cross each other as viewed in plan. Therefore, separation and rupture of the foot pattern 4 tends to be caused, starting at the intersection point between the outer edge portion of the foot pattern 4 and the outer edge portion of the resist 5 which covers the foot pattern 4.

The example illustrated in FIG. 9 is for reference. At the locations at which the outer edge portion of the foot pattern 4 and the outer edge portion of the resist 5 intersect each other as viewed in plan, the angle formed between the outer edge portion of the foot pattern 4 which is covered by the resist 5 and the outer edge portion of the resist 5 which covers the foot pattern 4 is an acute angle. Therefore, separation and rupture of the foot pattern 4 tends to be caused, starting at the intersection point between the outer edge portion of the foot pattern 4 and the outer edge portion of the resist 5 which covers the foot pattern 4.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A printed substrate comprising:
a substrate;
a copper layer formed on the substrate; and
a resin formed on the substrate to cover a part of the copper layer, wherein the copper layer includes a first region covered by the resin and a second region in which a shield sheet metal is installed, the shield sheet metal surrounding a predetermined region of the substrate, and wherein an angle formed between an outer edge portion of the copper layer covered by the resin and an outer edge portion of the resin which covers the copper layer at a location at which the outer edge portion of the copper layer and the outer edge portion of the resin intersect each other as viewed in plan is an obtuse angle.

2. The printed substrate according to claim 1, wherein the outer edge portion of the copper layer is formed as curved at the location at which the outer edge portion of the copper layer and the outer edge portion of the resin intersect each other as viewed in plan.

3. The printed substrate according to claim 1, wherein the outer edge portion of the copper layer is formed linearly at the location at which the outer edge portion of the copper layer and the outer edge portion of the resin intersect each other as viewed in plan.

4. The printed substrate according to claim 1, the shield sheet metal is fixed to the second region by solder.

5. A shield sheet metal fixing method comprising:

forming a copper layer on a substrate;

forming a resin that covers a part of the copper layer on the substrate; and fixing a shield sheet metal to the copper layer using solder, wherein an angle formed between an outer edge portion of the copper layer covered by the resin and an outer edge portion of the resin which covers the copper layer at a location at which the outer edge portion of the copper layer and the outer edge portion of the resin intersect each other as viewed in plan is an obtuse angle.

\* \* \* \* \*